US011313900B2

(12) United States Patent
Saini et al.

(10) Patent No.: US 11,313,900 B2
(45) Date of Patent: Apr. 26, 2022

(54) METHODS AND DEVICES FOR MEASURING LEAKAGE CURRENT

(71) Applicant: STMicroelectronics International N.V., Geneva (CH)

(72) Inventors: Pravesh Kumar Saini, Greater Noida (IN); Shashwat, Kaushambi (IN)

(73) Assignee: STMICROELECTRONICS INTERNATIONAL N.V., Geneva (CH)

( * ) Notice: Subject to any disclaimer, the term of this patent is extended or adjusted under 35 U.S.C. 154(b) by 61 days.

(21) Appl. No.: 17/001,131

(22) Filed: Aug. 24, 2020

(65) Prior Publication Data

US 2022/0057446 A1 Feb. 24, 2022

(51) Int. Cl.
*G01R 31/28* (2006.01)
*H03K 17/687* (2006.01)
*H03K 19/20* (2006.01)
*G01R 31/52* (2020.01)

(52) U.S. Cl.
CPC ......... *G01R 31/2884* (2013.01); *G01R 31/52* (2020.01); *H03K 17/6872* (2013.01); *H03K 19/20* (2013.01)

(58) Field of Classification Search
CPC ................ G01R 31/2884; G01R 31/52; H03K 17/6872; H03K 19/20

USPC ...................................... 324/750.3, 537, 500
See application file for complete search history.

(56) References Cited

U.S. PATENT DOCUMENTS

| | | | |
|---|---|---|---|
| 7,038,483 B1 | 5/2006 | Suzuki et al. | |
| 8,310,269 B2* | 11/2012 | Bhushan | G01R 31/3008 324/762.02 |
| 9,448,125 B2 | 9/2016 | Singh et al. | |
| 9,639,652 B2 | 5/2017 | Chang et al. | |
| 2012/0169362 A1* | 7/2012 | Oh | G06F 30/327 324/750.3 |
| 2012/0212245 A1* | 8/2012 | Pinto | H01L 22/34 324/750.3 |

\* cited by examiner

*Primary Examiner* — Giovanni Astacio-Oquendo
(74) *Attorney, Agent, or Firm* — Slater Matsil, LLP

(57) ABSTRACT

An on chip leakage-current detection device including a first inverter where the magnitude of delay of the output signal of the first inverter is determined by a leakage current of a target device. The leakage-current detection device further includes: a capacitor that is charged by the output signal of the first inverter; a second inverter coupled to capacitor that switches states when the capacitor is charged to a switching level; an odd number of additional inverters coupled in a sequence with a second-inverter output. The output of the leakage-current detection device has a frequency proportional to the leakage of the target device.

25 Claims, 10 Drawing Sheets

METHODS AND DEVICES FOR MEASURING LEAKAGE CURRENT

TECHNICAL FIELD

The present invention relates to methods and devices for measuring leakage current of a system on a chip.

BACKGROUND

Technologies employing System on a Chip ("SoC") devices are now part of everyday life. They may be used in a virtually unlimited range of applications and devices. The race for faster and better SoCs has led to techniques to enhance the speed of a given die for an SoC. Some techniques involve forward biasing electrical components on the SoC. However, increased speed realized from such techniques may also increase the leakage current of an SoC and therefore power consumption. This can impact the power efficiency of an SoC in undesirable ways. Leakage detection can provide a tool for managing power efficiency for any type of SoC. Known leakage-current detection methods such as Iddq testing, are time consuming and may not be performed in the field. An on-chip leakage current detection device can provide more efficient and convenient options for leakage-current detection and measurement including, but not limited to, in-field testing.

SUMMARY

In accordance with an embodiment of the present invention, an on chip leakage-current detection device includes a first inverter that produces a first high output signal when it receives a low input signal at an input and produces a first low output signal when it receives a high input signal at the input The magnitude of the first high output signal of the first inverter is determined by a leakage current of a target device coupled with the first inverter.

The on chip leakage-current detection device further includes a voltage storage device coupled to an output of the first inverter, wherein a time to charge the voltage storage device depends on the magnitude of the first high output signal. The device may further include a second inverter coupled to the voltage storage device that produces a second high output signal when a charge on the voltage storage device is below a switching threshold and produces a second low output signal when the charge on the voltage storage device is above the switching threshold. The switching threshold is determined by a biasing circuit coupled with the second inverter. The device may further include an odd number of additional inverters coupled in a sequence with an output of the second-inverter. A last output of a last inverter in the sequence is coupled with the input of the first inverter and a frequency of an output signal produced at the last output of the last inverter in the sequence depends on the time to charge the voltage storage device.

In accordance with an embodiment of the present invention an on chip leakage-current detection device includes a first inverter that includes: a PMOS transistor, with a source of the PMOS transistor coupled to a power supply. The on chip leakage-current detection device further includes: an NMOS transistor, with a source of the NMOS transistor being coupled to a ground and; an output node disposed between a drain of the PMOS transistor and a drain of the NMOS transistor. The input of the first inverter is coupled to a control gate of the PMOS transistor and a control gate of the NMOS transistor.

The on chip leakage-current detection device further includes: a target device coupled in series between the drain of the PMOS transistor and the drain of the NMOS transistor so a leakage current flows through the target device to the output node when the target device is in an OFF state; a storage capacitor coupled at a first plate to the output node of the first inverter and coupled at a second plate to the ground; and a second inverter that produces a high output signal when a charge on the storage capacitor is below a switching threshold and produces a low output signal when the charge on the storage capacitor is above the switching threshold.

The switching threshold is determined by a biasing circuit coupled with the second inverter includes: a biasing PMOS transistor, with a source of the biasing PMOS transistor coupled to the power supply; an inverting PMOS transistor, with a source of the inverting PMOS transistor coupled to a drain of the biasing PMOS transistor; an inverting NMOS transistor, with a drain of the inverting NMOS transistor coupled to a drain of the inverting PMOS transistor; a biasing NMOS transistor, with a drain of the biasing NMOS transistor coupled to a source of the inverting NMOS transistor and a source of the biasing NMOS transistor being coupled to the ground. The first plate of the storage capacitor is coupled to a control gate of the inverting NMOS transistor and a control gate of the inverting PMOS transistor and an output of the biasing circuit is coupled to the control gate of the biasing PMOS transistor and coupled to the control gate of the biasing NMOS transistor.

The on chip leakage-current detection device further includes an odd number of additional inverters coupled in a sequence with an output of the second-inverter a last output of a last inverter in the sequence is coupled with the input of the first inverter and a frequency of an output signal produced at the last output of the last inverter in the sequence depends on a time to charge the storage capacitor.

In accordance with an embodiment of the present invention a method to approximate a leakage current of a system-on-a-chip during a mode of operation includes: coupling a first transistor with a first on chip leakage-current detection device, wherein the first transistor is a first flavor; converting a leakage current of the first transistor into a first signal using the first on chip leakage-current detection device, wherein the first signal has a first frequency determined by a magnitude of the leakage current of the first transistor; coupling a second transistor with a second on chip leakage-current detection device, wherein the second transistor is a second flavor; converting a leakage current of the second transistor into a second signal using the second on chip leakage-current detection device, wherein the second signal has a second frequency determined by a magnitude of the leakage current of the second transistor; summing the first frequency and the second frequency in proportion to a number of transistors of the first flavor that are OFF during the mode of operation and a number of transistors of the second flavor that are OFF during the mode of operation to generate a sum; and deriving an approximation of the leakage current of the system-on-a-chip during the mode of operation from the sum.

In accordance with an embodiment of the present invention a method to approximate a leakage current of a system-on-a-chip during a mode of operation includes: corresponding the size of a first transistor that is a first flavor to a number of transistors of the first flavor that are OFF during the mode of operation; corresponding the size of a second transistor that is a second flavor to a number of transistors of the second flavor that are OFF during the mode of operation;

coupling the first transistor with an on chip leakage-current detection device and coupling the second transistor with the on chip leakage-current detection device wherein the first transistor is in parallel with the second transistor; converting a leakage current of the first transistor and a leakage current of the second transistor into a first signal using the on chip leakage-current detection device wherein the first signal comprises a first frequency proportional to a sum of a magnitude of the leakage current of the first transistor and a magnitude of the leakage current of the second transistor; and deriving an approximation of the leakage current of the system-on-a-chip during the mode of operation from the first frequency.

BRIEF DESCRIPTION OF THE DRAWINGS

One or more embodiments will now be described, by way of example only, with reference to the annexed figures, wherein.

DETAILED DESCRIPTION OF ILLUSTRATIVE EMBODIMENTS

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

The references used herein are provided merely for convenience and hence do not define the extent of protection or the scope of the embodiments.

In various embodiments an on-chip leakage-current detection device may comprise a ring oscillator.

Figure 1:
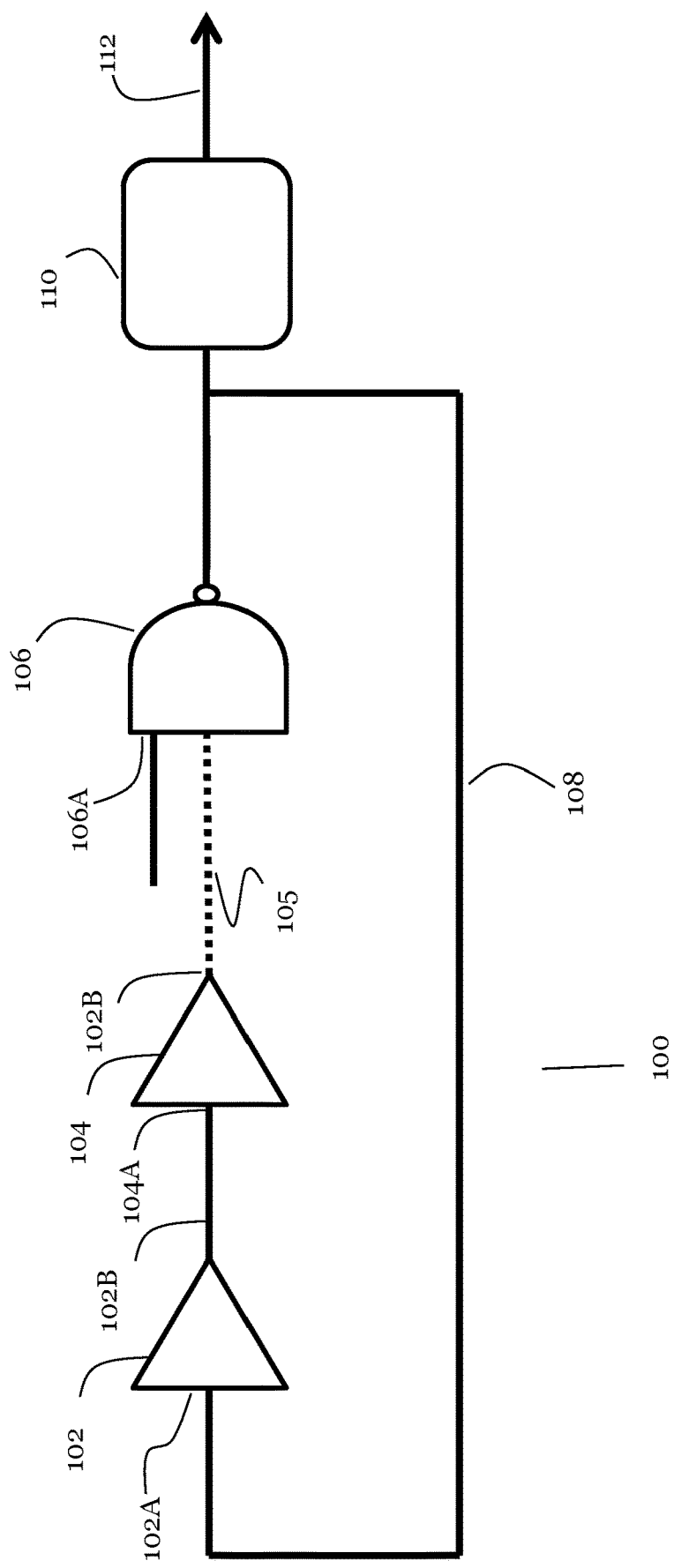
FIG. 1 depicts a block diagram of a ring oscillator.

FIG. 1 depicts a block diagram of a ring oscillator 100 for a leakage-current detection circuit in accordance with an embodiment of the present application. In various embodiments, a ring oscillator 100 may generate an output signal that has a frequency dependent on the switching delay of a number of inverters of the ring oscillator 100. The ring oscillator 100 may comprise an odd number of inverters.

A first inverter 102 may comprise a first inverter input 102A and a first inverter output 102B. The first inverter 102 may receive an input signal at the first inverter input 102A. The input signal may comprise a state such as a high or a low state. In various embodiments, the state of the input and output signals may be described by reference to a reference value. For example, the reference value may comprise a voltage level and a signal having a voltage level greater than the reference value may be described as having a high state and a signal having a value less than a voltage level may be described as having a low state. The first inverter 102 may be configured to produce an output signal at the first inverter output 102B that has an opposite state of the input signal thereby inverting the signal. Continuing with the example described above, the first inverter 102 may receive a signal described as having a high state and produce a signal having a low state and vice versa.

The first inverter output 102B may be coupled with a second inverter 104 that, like the first inverter 102, may invert an input signal received at a second-inverter input 104A to produce an output signal at a second inverter output 104B having an opposite state as the input signal received by the second inverter 104.

As will be appreciated by one of ordinary skill in the art, the output signal of the second inverter 104 may comprise the same state, after any delays, as the input signal received by first inverter 102. The second inverter output 104B may be coupled with an odd number of additional inverters. This is represented by dashed line 105 in FIG. 1. An ring oscillator output 108 may be fed back to the first inverter input 102A.

Having an odd number of inverters in the ring oscillator 100 may ensure that a signal at the ring oscillator output 108 may assume the opposite state as the input signal received at the first inverter input 102A after any delay the ring oscillator. Coupling the ring oscillator output 108 with the first inverter input 102A may cause the output signal at the ring oscillator output 108 to alternate states with a frequency dependent on the delay of the ring oscillator 100.

In various embodiments, the ring oscillator 100 may also comprise a component to enable or disable the ring oscillator. This may comprise a NAND gate 106. The NAND gate may receive a power down signal 106A.

In various embodiments, the ring oscillator 100 may also be coupled with a frequency divider 110. The frequency divider 110 may reduce the frequency of a signal at the ring oscillator output 108. by a factor N. In various embodiments the factor N may take different values. For example, N may be equal to 2, in various embodiments and the signal at the ring oscillator output 108. may be divided by 2. It may be advantageous to couple the ring oscillator output 108 with a frequency divider 110 to reduce the frequency for processing of the signal.

As mentioned above, the frequency of the ring oscillator 100 may depend on the delay of the ring oscillator 100. The less time it takes for a signal to matriculate through the ring oscillator 100, the greater the frequency of a signal produced at the ring oscillator output 108. This principle may be leveraged to detect a leakage current. A ring oscillator 100 having a delay that corresponds to the magnitude of a leakage current may produce a signal that has a frequency proportional to the magnitude of the leakage current.

This can aid understanding of power-efficiency concerns. For example, a leakage-current detection device may be utilized to track, or predict, leakage during various modes of operation. Different modes of operation may have different levels of forward biasing, use different arrangements of components, like transistors, and may generate different amounts of leakage. A leakage-current detection circuit can provide information that helps designers understand trade-offs between power efficiency and forward biasing or any other techniques used for a chip.

It may also be desirable to equip an SoC with a leakage-current detection device that is accurate for different operating conditions. Changes in temperature or other operating conditions may impact different factors contributing to the delay of a ring oscillator 100 in a non-uniform way. For example, a change in temperature may alter a delay introduced into a ring oscillator to track leakage current differently than other delays of the ring oscillators. This may negatively impact the ability of a leakage-current detection device with a ring oscillator to measure leakage currents. Temperature and other operating conditions of an SoC may also vary by operating modes so this may also undermine the ability of a leakage-current detection device. Therefore it may be desirable to have an on-chip leakage-current detection device with a ring oscillator that provides a consistent, or predictable, delay.

Figure 2:
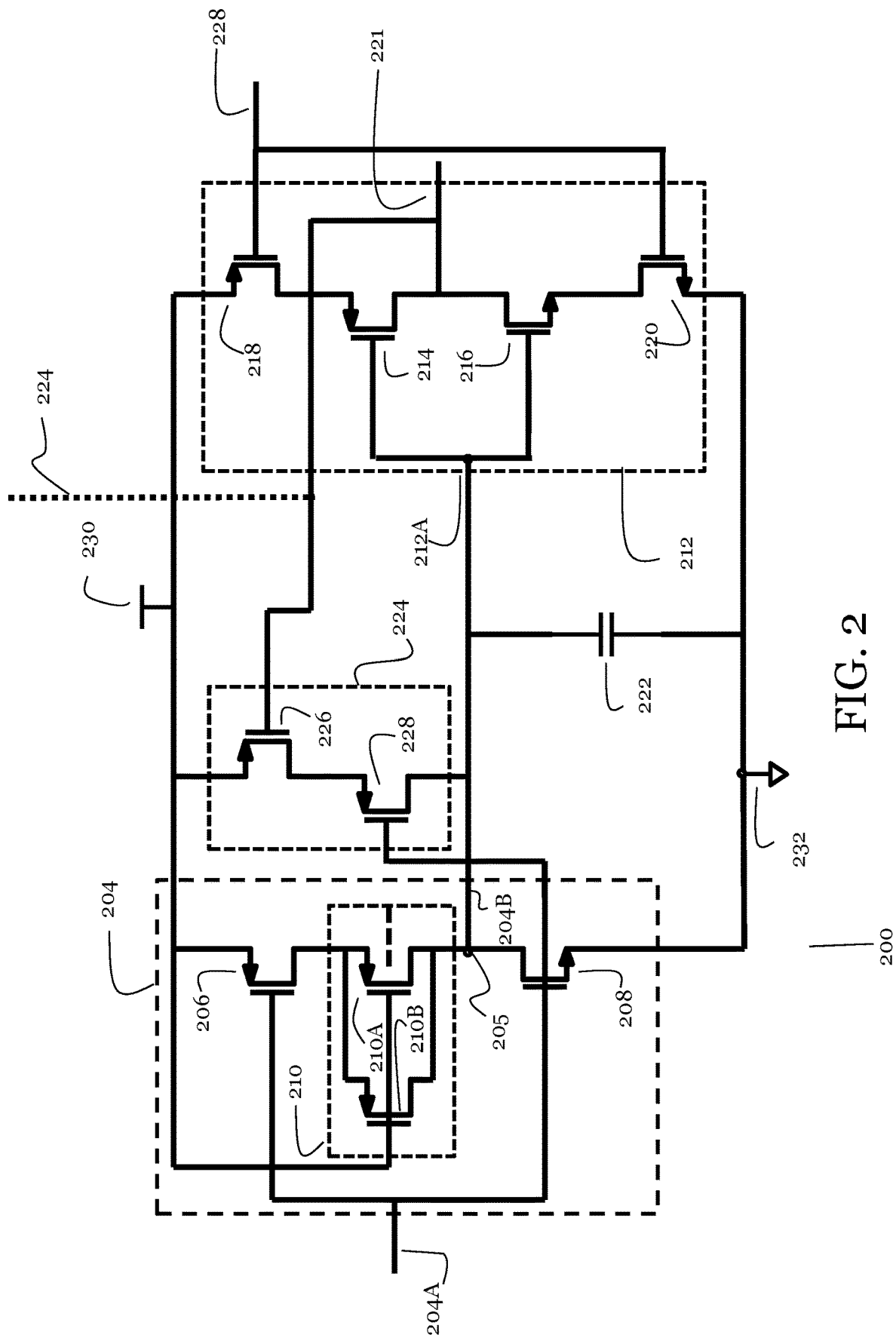
FIG. 2 depicts an on-chip leakage-current detection device of embodiments of the present disclosure.

FIG. 2 depicts an on-chip leakage-current detection device 200 of embodiments of the present disclosure.

The on chip leakage-current detection device may comprise, in various embodiments a first inverter 204. The first inverter 204 may be coupled with a target device 210 to receive a leakage current from the target device 210, which may be measured by the on-chip leakage-current detection device 200. The first inverter 204 may also be coupled to a first inverter input 204A. The first inverter 204 may also comprise a first inverter output 204B.

The first inverter 204 may be configured to produce a first high output signal when it receives a low input signal at the first inverter input 204A and configured to produce a first low output signal when it receives a high input signal from the first inverter input 204A. The first low output signal and the first high output signal may be defined relative to a reference level (for example a voltage level) in various embodiments wherein a value greater than the reference level is considered to be a high signal and a value lower than the reference level is considered to be a low signal. The first inverter 204 may also be configured so that the magnitude of the first high output signal of the first inverter is determined by a leakage current of the target device 210 coupled with the first inverter 204. In various embodiments, the magnitude of the first high output signal increases proportionally to increases in the leakage current of the target device 210.

The on-chip leakage-current detection device 200 may also comprise a voltage storage device 222 coupled to the first inverter output 204B. The voltage storage device 222 may charge as a function of the magnitude of the high output signal. The time to charge the voltage storage device 222 may depend on the magnitude of the first high output signal, which in turn may depend on the leakage current of the target device 210. For example, the higher the leakage current of the target device 210, the higher the magnitude of the output signal of the first inverter 204, and the less time it takes to charge the voltage storage device 222. The may create a delay in the on-chip leakage-current detection device 200 that depends on the magnitude of the leakage current of the target device 210.

In various embodiments the on-chip leakage-current detection device 200 may comprise a second inverter 212 coupled to the voltage storage device 222. Like the first inverter 204, the second inverter 212 may be configured to produce a high output signal when it receives a low input signal at the second inverter input 212A and configured to produce a low output signal when it receives a high input signal. The low output signal and the high output signals may be defined relative to a reference level (for example a voltage level) in various embodiments wherein a value greater than the reference level may be considered to be a high signal and a value lower than the voltage level may be considered to be a low signal. The reference voltage may also comprise a switching threshold where the second inverter is triggered to switch its output from one state for another.

The voltage storage device 222 may be coupled with the second inverter input 212A. The second inverter 212 thus may be configured to produce a high output signal at second inverter output 221 when a charge on the voltage storage device 222 is below a switching threshold and to produce a low output signal when the charge on the voltage storage device 222 is above the switching threshold. The value of the switching threshold may be determined by a biasing circuit coupled with the second inverter, which will be explained in more detail at least with reference to FIG. 4. The biasing circuit may maintain the switching threshold at a substantially constant value in different operating conditions.

The on-chip leakage-current detection device 200 may also comprise an odd number of additional inverters coupled in a sequence with the second inverter output 221. As will be appreciated the number of the odd number of additional inverters may vary in different embodiments. For example, some embodiments of the on-chip leakage-current detection device 200 may comprise 9 additional inverters or any other odd number of additional inverters. The odd number of additional inverters may be configured receive an input have a first state (like a high state) and output a signal having an inverted state (like a low state) where the outputs of the inverters are coupled to the inputs of the next inverter in the sequence. The last output of a last inverter in the sequence may be coupled with the input of the first inverter. The time to charge the voltage storage device 222, and the leakage current of the target device may thus determine a frequency of an output signal at the last inverter. Additional inverters may also comprise any variety of inverter known in the art.

The on-chip leakage-current detection device 200 may comprise many embodiments. As depicted in FIG. 2, the first inverter 204 may comprise a PMOS transistor 206. A source of the PMOS transistor 206 may be configured to be coupled to a power supply 230. The first inverter 204 may also comprise an NMOS transistor 208 wherein a source of the NMOS transistor may be coupled to a ground node 232. In FIG. 2, the first inverter 204 comprises an output node 205 disposed between a drain of the PMOS transistor 206 and a drain of the NMOS transistor 208.

In various embodiments, first inverter input 204A may be coupled to a control gate of the PMOS transistor 206 and a control gate of the NMOS transistor 208. The target device 210 may be coupled in series between the drain of the PMOS transistor 206 of the first inverter 204 and the drain of the NMOS transistor 208.

A leakage current may flow through target device 210 to the output node 205 when the target device 210 is in an OFF state. In various embodiments, it may be advantageous to configure the target device 210 to be maintained in an OFF state. The target device 210 may comprise a first transistor 210A. The target device may also comprise a second transistor 210B coupled in parallel with the first transistor 210A. In the embodiment depicted in FIG. 2, both the first transistor 210A and the second transistor 210B comprise PMOS transistors. The source of the first transistor 210A may be coupled to the drain of the PMOS transistor 206 of the first inverter 204. The source of the second transistor 210B may be coupled to the drain of the PMOS transistor 206 of the first inverter 204. The drain of the first transistor 210A may be coupled to the drain of the NMOS transistor 208 of the first inverter 204. The drain of the second transistor 210B may be coupled to the drain of the NMOS transistor 208 of the first inverter 204. In various embodiments, a control gate of the first transistor 210 A may be coupled to the power supply 230. A control gate of the second transistor 210B may be coupled to the power supply 230. For PMOS transistors, this arrangement may ensure that the voltage at the gate of the first transistor 210A is equal or greater than the voltage of the source of the first transistor 210A thereby keeping the transistor in an OFF state.

In various embodiments, the voltage storage device 222 comprises a capacitor The capacitor may comprise a CMOM capacitor formed in an integrated circuit. A first plate of the voltage storage device 222 may be coupled to the output node 205 of the first inverter 204. A second plate may be coupled the ground 232.

The second inverter may comprise a biasing PMOS transistor 218. A source of the biasing PMOS transistor 218 may be configured to be coupled to the power supply 230.

In various embodiments, the second inverter 212 may comprise an inverting PMOS transistor 214 wherein a source of the inverting PMOS transistor 214 may be coupled to a drain of the biasing PMOS transistor 218. In various embodiments, the second inverter 212 may further comprise an inverting NMOS transistor 216. A drain of the inverting NMOS transistor 216 may be coupled to a drain of the inverting PMOS transistor 214. The second inverter 212 may also comprise a biasing NMOS transistor 220 wherein a drain of the biasing NMOS transistor 220 may be coupled to a source of the inverting NMOS transistor 216. A source of the biasing NMOS transistor may be coupled to the ground 232.

The first plate of the voltage storage device 222 may be coupled to a control gate of the inverting NMOS transistor 216 and a control gate of the inverting PMOS 214 transistor. In various embodiments, a biasing-circuit output 228, which will be described in more detail at least with reference to FIG. 4, may be coupled to the control gate of the biasing PMOS transistor 218 and the control gate of the biasing NMOS transistor 220. An odd number of additional inverters may be coupled in a sequence with the second-inverter output 221. This is represented by the dashed line 224 in FIG. 2.

As discussed above with reference to the ring oscillator 100 of FIG. 1, a last output of a last inverter in the sequence may be coupled with the input 204A of the first inverter so a frequency of an output signal produced at the last output of the last inverter in the sequence depends on a time to charge the voltage storage device 222, which may comprise a capacitor.

For illustrative purposes operation of the on chip leakage-current detection device 200, will now be described. When the input of the first inverter 204A receives a high signal, in various embodiments it may simultaneously be delivered to the control gate of the PMOS transistor 206 and the control gate of the NMOS transistor 208. The PMOS transistor 206 may then be in an OFF state and the NMOS transistor 208 in an ON state. This may leave no voltage at the output node 205 and the first inverter may produce a low signal, the opposite state of the signal received at the first inverter input 204A.

This low signal (below the switching threshold) may be delivered to the second inverter input 212A and on to the control gate of the inverting PMOS 214 and the control gate of the inverting NMOS transistor 216. Operation of the biasing PMOS transistor 218 and the biasing NMOS transistor 220 will be discussed at least with reference to FIG. 4 elsewhere in this application. The inverting PMOS 214 may then be on and the inverting NMOS transistor 216 off. This may generate a high output signal at second-inverter output 221, which can then be delivered to the next inverter in the sequence of inverters and, eventually, to the first inverter 204 via first inverter input 204A. With an odd number of additional inverters the signal at the output of the last inverter may have the opposite state of the signal received at the first inverter input 204A, which in this example would be low.

When the first inverter input 20A receives a low input signal, the low input signal may be delivered to the control gate of the PMOS transistor 206 putting the PMOS transistor 206 in an ON state. The power supply 230 may then be delivered to the target device 210. Being configured to be maintained in an OFF state, any current flowing through the target device 210 will be leakage current. The leakage current from the target device 210 may flow to output node 205. In various embodiments where the target device 210 comprises more than one transistor the leakage current of the transistors may be aggregated and flow to output node 205.

The low input signal may also delivered to the control gate of the NMOS transistor 208 turning the NMOS transistor 208 OFF. The leakage current from the target device 210 may then charge voltage storage device 222. The greater the leakage current, the faster the voltage storage device 222 may charge. When charge on voltage storage device 222 reaches the switching threshold, the second inverter 212 may be tripped and the output signal of the second inverter 212 may switch to a low state as the inverting PMOS 214 is turned OFF and the inverting NMOS transistor 216 is turned ON. The oscillation of a signal produced at the last inverter of the sequence of an odd number of additional inverters may thus depend on the time to charge the voltage storage device 222 and the leakage current of target device 210.

In various embodiments the on-chip leakage-current detection device 200 may further comprise a latch 224. The latch may operate to provide a voltage $V_{DD}$ from the power supply 230 to the output node 205. of the first inverter after the second inverter 212 has been switched. This may be advantageous to prevent fluctuations in the voltage level at the output node 205 during operation of the on-chip leakage-current detection device 200 from undesirably tripping the second inverter 212.

In various embodiments, the latch 224 may comprise a first PMOS transistor 226 with a source configured to be coupled to the power supply 230. The control gate of the first PMOS transistor 226 may be coupled to the second-inverter output 221. The latch 224 may further comprise a second PMOS transistor 228. The source of the second PMOS transistor 228 may be coupled to the drain of the first PMOS 226 transistor A control gate of the second PMOS transistor 228 may be coupled to the input of the first inverter 204A, and a drain of the second PMOS transistor may be coupled to the output node of the first inverter 205.

When the input signal received at the first inverter input 204A is low, the second PMOS transistor 228 may be ON. After the second inverter 212 has been tripped the output signal at the second-inverter output 221 may also be low turning off the first PMOS transistor 226, which may open a path between power supply 230 and output node 205 for application of $V_{DD}$.

In various embodiments, the on chip leakage-current detection device 200 may be coupled with a NAND gate 106, as described with reference to FIG. 1, or other component for disabling or enabling the on-chip leakage-current detection device 200. The on chip leakage-current detection device 200 may also be coupled with a frequency divider 110, as described with reference to FIG. 1.

Figure 3:
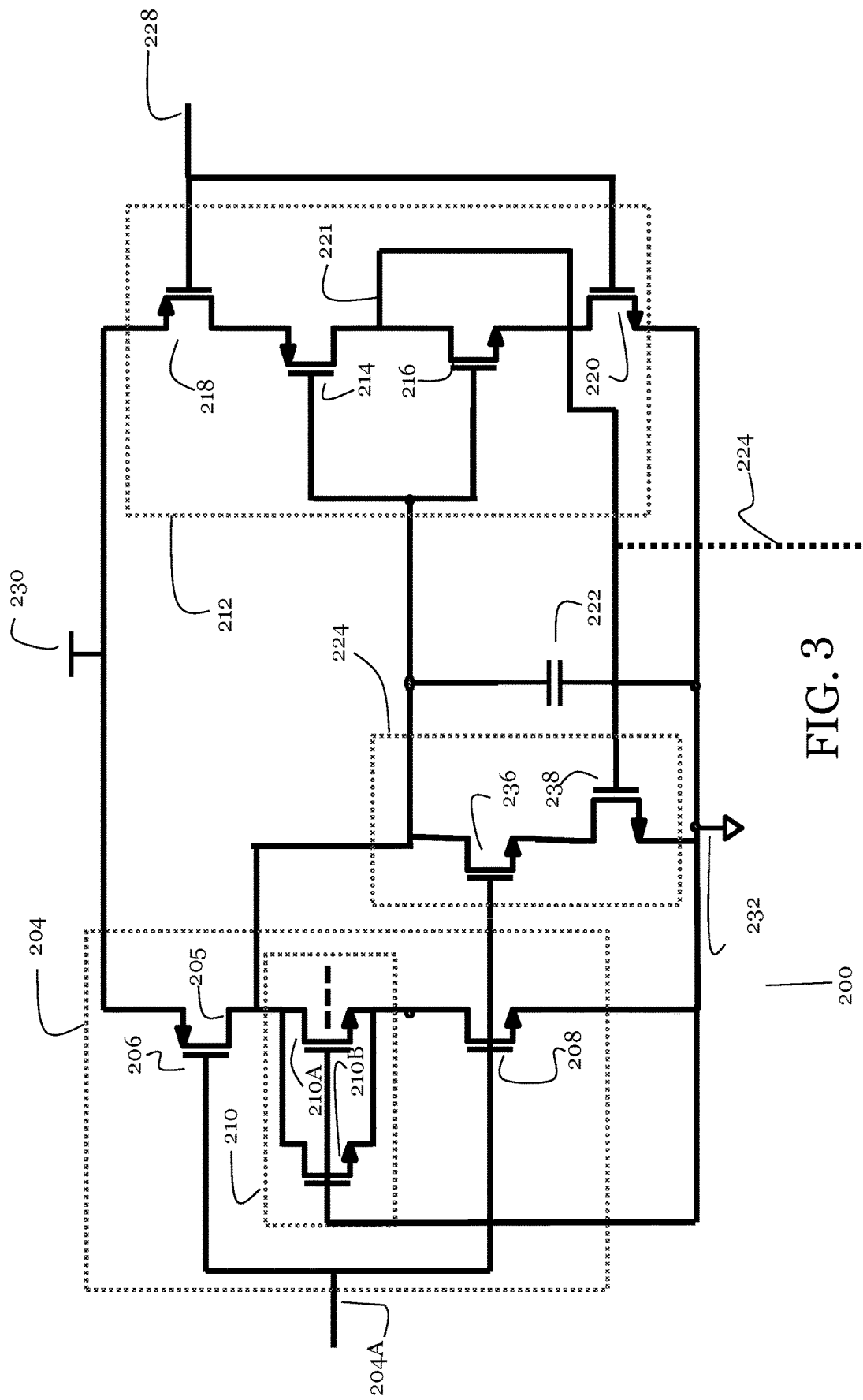
FIG. 3 depicts an on-chip leakage-current detection device of embodiments of the present disclosure.

FIG. 3 depicts an on chip leakage-current detection device 200 of embodiments of the present disclosure.

In various embodiments, the first transistor 210A may comprise an NMOS transistor. The second transistor 210A may comprise an NMOS transistor. As discussed with respect to embodiments wherein the first transistor 210A and the second transistor 210B comprise PMOS transistors, it may be advantageous to configure the target device 210 so that the target device 210 in in an OFF state. In various embodiments wherein the first transistor 210A and the second transistor 210, if present, comprise NMOS transistors a control gate of the first transistor may be coupled to the ground node 232. A source of the first transistor 210A may be coupled to a drain of the NMOS transistor 208. A drain of the first transistor 210A may be coupled to a drain of the PMOS transistor 206. This may ensure that the voltage at the control gate of the first transistor 210A will be less than the voltage at the source and the first transistor 210A may be maintained in an OFF state.

If a second transistor 210B is present, it may be coupled in parallel arrangement with the first transistor so that it may also be maintained in an OFF state. As will be appreciated, the target device 210 may comprise additional transistors in various embodiments. Any additional transistors may also be coupled in a parallel arrangement with the first transistor 210A As depicted in FIG. 3, in various embodiments, the output node 205 may be disposed between the drain of the PMOS transistor 206 and the drain the first transistor 210A. This arrangement may be employed in embodiments when the first transistor 210A comprises an NMOS transistor as in FIG. 3.

In various embodiments, the latch 224 may comprise a first NMOS 236 and a second NMOS 238. A drain of the first NMOS 236 may be coupled to the output node 205. The control gate of the first NMOS 236 may be coupled to the first inverter input 204A. And, a source of the first NMOS 236 may be coupled to a drain of the second NMOS 238. The source of the second NMOS may be coupled to the ground node 232. And, the control gate of the second NMOS 238 may be coupled to the second-inverter output 221. When the input signal at the first inverter 204A is high, the first NMOS 236 may be ON. When the signal at the second-inverter output 221 is also high the second NMOS 238 will also be ON and PMOS 206 will be off.

The frequency of an output signal from the last inverter produced by the on-chip leakage-current detection device 200 may be function of the delay of the on-chip leakage-current detection device 200. This can be described the Equation 1 below.

$$RO\ Frequency = \frac{1}{(2*N*U_D)} \qquad \text{Equation 1}$$

In equation 1, RO frequency is the frequency of an output signal produced at the output of the last inverter. In some embodiments, a system for detecting leakage may comprise multiple cells with each cell comprising a leakage-current detection device 200. Output frequencies from leakage-current detection device may be summed. N, in Equation 1, may represent the number of cells contributing to the RO frequency. $U_D$ is the unit cell delay. The unit cell delay may be equal to the sum of the leakage cell delay, $T_D$, from the first inverter, and the threshold detector delay from the second detector for that cell. The leakage cell delay, $T_D$, may be described by Equation 2.

$$T_D = \frac{C*V_{trip}}{(I_{leak})} \qquad \text{Equation 2}$$

Where C is the capacitance of the voltage storage device 222, $I_{leak}$ is the leakage current of the target device 210, and $V_{trip}$ is the switching threshold of the second inverter 212. The impact of the threshold delay may be minimized by design criteria so impact of the leakage cell dominates the RO frequency. Equation 1 may thus be rewritten as Equation 3.

$$RO\ Frequency = \frac{I_{leak}}{(2*N*C*V_{trip})} \qquad \text{Equation 3}$$

In Equation 3, N and C may be considered constant values. With a biasing circuit, the value of $V_{trip}$, as will be described in more detail with reference to FIG. 4, may also be held substantially constant allowing the RO frequency to operate proportionally to only the leakage current of the target device 210. This may be advantageous to improve the accuracy of the on chip leakage-current detection device 200 and maintain accuracy for a range of operating conditions.

Figure 4:
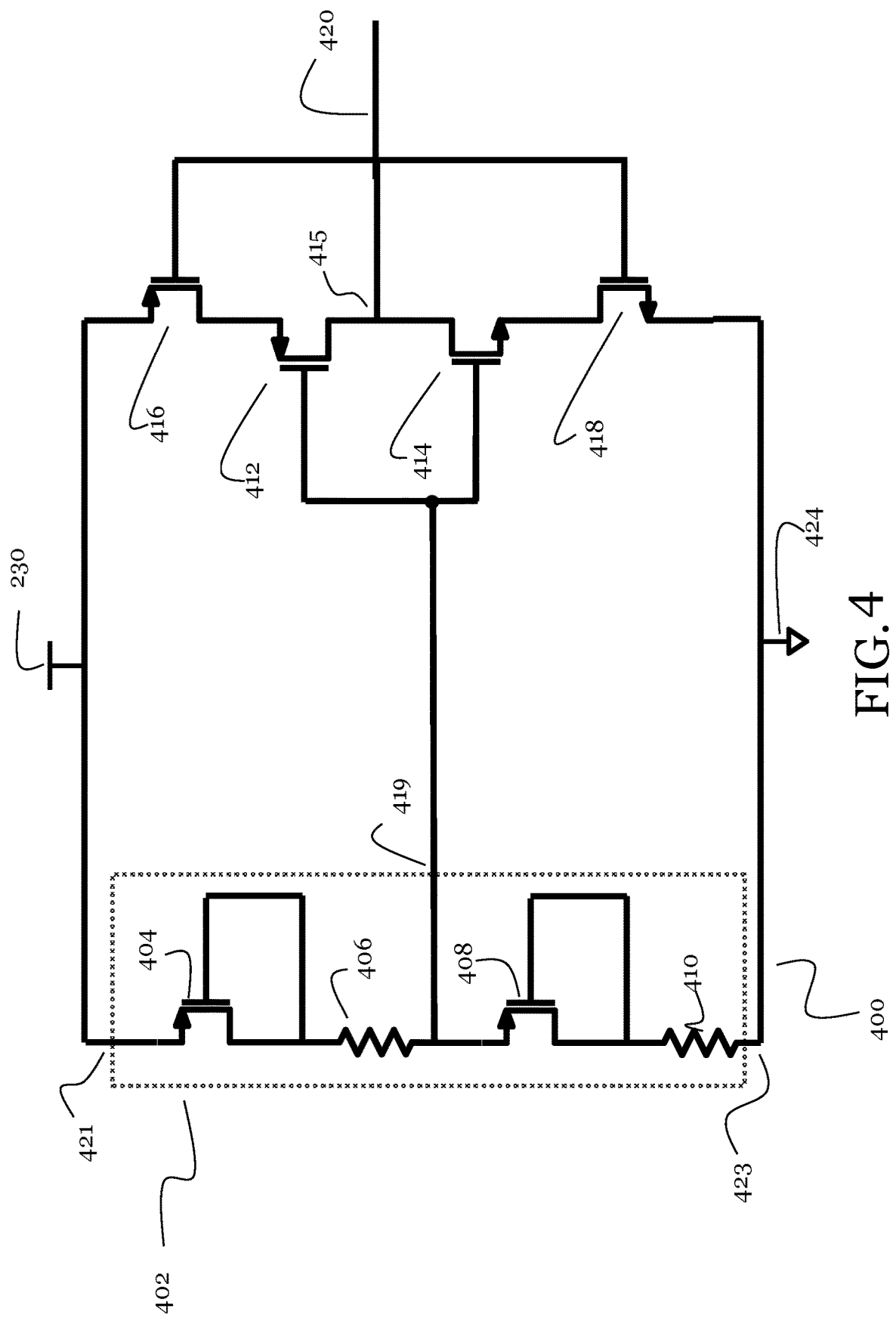
FIG. 4 depicts an embodiment of a biasing circuit of embodiments of the present disclosure.

FIG. 4 depicts an embodiment of a biasing circuit 400.

The biasing circuit 400 may comprise a biasing circuit output 228 that supplies a biasing voltage. The biasing circuit output 228 may be coupled to the control gate of biasing PMOS transistor 218 and the control gate of biasing NMOS transistor 220 of the second inverter 212 of the on chip leakage-current detection device 200. In various embodiments this may set the switching threshold, $V_{trip}$ of the second inverter 212.

In various embodiments the biasing circuit 400 may comprise a first biasing-circuit PMOS transistor 416 wherein a source of the first biasing-circuit PMOS transistor 416 may be configured to be coupled to the power supply 230. The biasing circuit 400 may further comprise a second biasing-circuit PMOS transistor 412. A source of the second biasing-circuit PMOS transistor 412 may coupled to a drain of the first biasing-circuit PMOS transistor 416.

In various embodiments the biasing circuit 400 may comprise a first biasing-circuit NMOS transistor 414. A drain of the first biasing-circuit NMOS 414 transistor may be coupled to a drain of the second biasing-circuit PMOS transistor 412. The biasing circuit may comprise a second biasing-circuit NMOS transistor 418 wherein a drain of the second biasing-circuit NMOS transistor 418 may be coupled to a source of the first biasing-circuit NMOS transistor 414 and a source of the second biasing-circuit NMOS transistor 418 may be coupled a ground node 424. It should be appreciated that the ground node 424 may be a common ground node with the ground node 232.

A negative feedback node 415 may be disposed between the drain of the second biasing-circuit PMOS transistor 412 and the drain of the first biasing-circuit NMOS transistor 414. The negative feedback node may be coupled to a control gate of the first biasing-circuit PMOS transistor 416 and a control gate of the second biasing-circuit NMOS transistor 418.

The biasing circuit 400 may also comprise a voltage divider 402 comprising a voltage divider output 419 between a first end 421 of the voltage divider 402 that may configured to be coupled to the power supply 230 and a second end 423 of the voltage divider that may be configured to be coupled to the ground node 424.

In various embodiments the control gate of the second biasing-circuit PMOS transistor 412 and a control gate of the first biasing-circuit NMOS transistor 414 may be coupled to the voltage divider output 419. The voltage provided to the control gate of the second biasing-circuit PMOS transistor 412 and a control gate of the first biasing-circuit NMOS transistor 414 may determine the switching voltage of the second inverter 212. The negative feedback of the biasing circuit 400 at node 415 may cause the voltage at node 415 to settle at a biasing voltage supplied to the control gate of biasing PMOS transistor 218 and the control gate of biasing NMOS transistor 220 (of second inverter 212) that will set the switching threshold of the second inverter 212 equal to the voltage supplied at the voltage divider output 419. This may allow the value for the switching voltage to be maintained at a constant, or substantially constant, value for different operating conditions so the frequency of an output signal of the on chip leakage-current detection device 200 may be proportional only to the leakage current of the target device 210.

In various embodiments, the biasing-circuit output 228 may also be coupled to one or more of the odd number of additional inverters to set a switching threshold of the respective one or more odd number of additional inverters.

It should be appreciated that the biasing PMOS transistor 218, inverting PMOS 214, inverting NMOS transistor 216, and biasing NMOS transistor 220 may mirror the first biasing-circuit PMOS transistor 416, second biasing-circuit PMOS transistor 412, first biasing-circuit NMOS transistor 414, and second biasing-circuit NMOS transistor 418, respectively.

In various embodiments, the voltage divider 402 may comprise a first PMOS transistor 404, a first resistor 406, a second PMOS transistor 408, and a second resistor 410 in series between the power supply 230 and ground node 424. The properties of these components (such as resistance) may be selected to configure to voltage divider 402 to deliver the voltage desired to the voltage divider output 426 as is well known in the art. For example, the aforementioned components of the voltage divider may be selected to deliver a voltage at ½, ⅓ or any other fraction of the voltage supplied by power supply 230. In various embodiments, the voltage divider 402 may comprise a purely resistive voltage divider or purely transistor driven.

Figure 5:
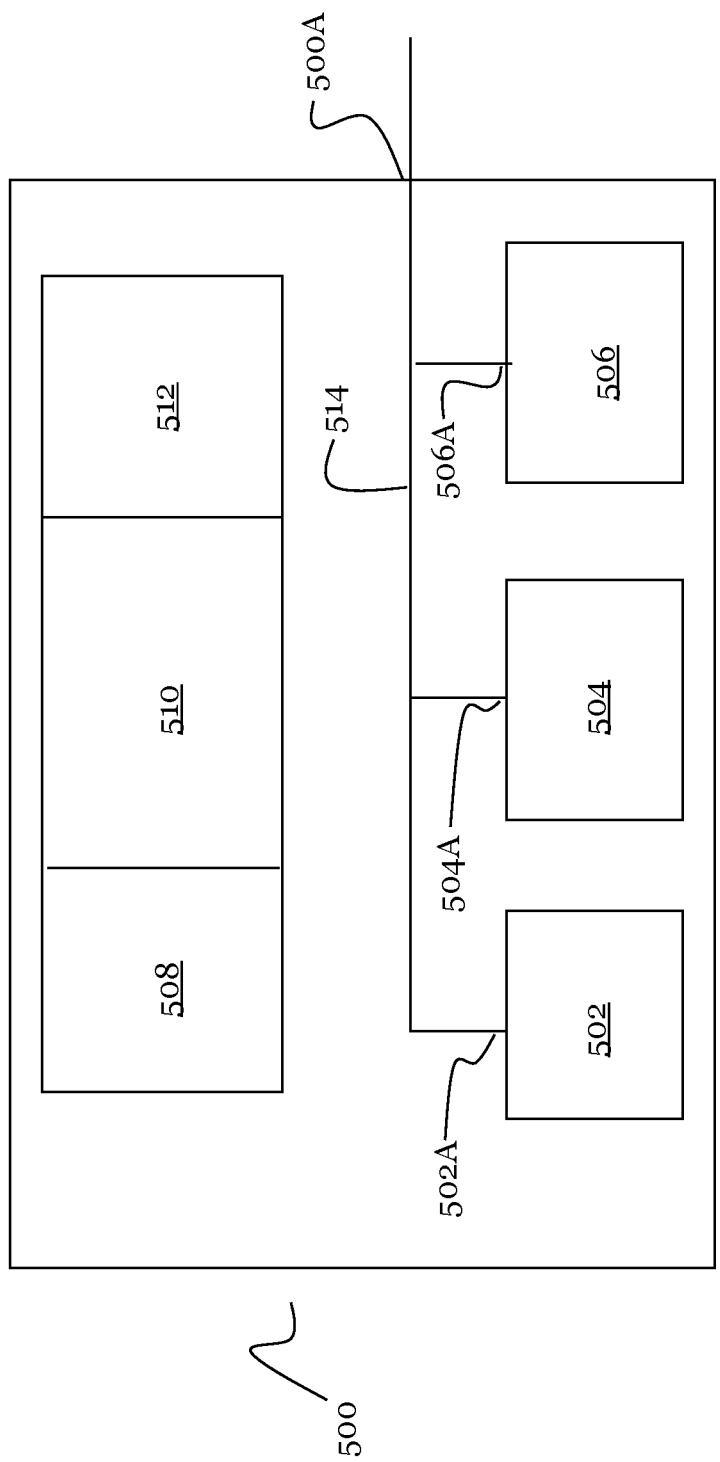
FIG. 5 depicts a system for detecting leakage current on a system-on-a-chip of embodiments of the present disclosure.

FIG. 5 depicts a system for detecting leakage current on a system-on-a-chip 500.

The on-chip leakage-current detection device 200 allows accurate and efficient on chip measurement or approximation of on chip leakage. As will be appreciated by one of ordinary skill in the art, a system-on-a-chip 500 may utilize a variety of flavors of transistors or MOSFETS. Flavors of a MOSFET may include high voltage threshold MOSFETS, low voltage threshold MOSFETS, ultra voltage threshold MOSFETS, and other varieties of MOSFETS. In various embodiments, a system-on-a-chip 500 may comprise an on-chip leakage-current detection device 200 for each flavor used on a system-on-a-chip 500.

For illustrative purposes, a system-on-a-chip 500 may comprise a number of transistors of a first flavor 508, a number of transistors of a second flavor 510, and a number of transistors of a third flavor 512. The system-on-a-chip 500 may also comprise an on-chip leakage-current detection device for the first flavor 502, an on-chip leakage-current detection device for the second flavor 504, and an on-chip leakage-current detection device for the third flavor 506. The system-on-a-chip 500 may also comprise additional flavors and additional on-chip leakage-current detection devices. Each of these on chip leakage-current detection devices may comprise any embodiment of the on chip leakage-current detection device 200 and biasing circuit 400 as described in this disclosure. It should also be noted that number of each flavor of transistors is represented with corresponding blocks in diagram in this figure but, one will appreciate that does not reflect any particular physical arrangement of transistors.

A target device 210 of on chip leakage-current detection device for the first flavor 502 may comprise one or more transistors comprising the first flavor so the on chip leakage-current detection device 502 can produce an output signal with a frequency proportional to the leakage of the first flavor at output 502A. A target device 210 of on chip leakage-current detection device for the second flavor 504 may comprise one or more transistors comprising the second flavor so the on chip leakage-current detection device 504 can produce an output signal with a frequency proportional to the leakage of the second flavor at output 504A. And, a target device 210 of on chip leakage-current detection device for the third flavor 506 may comprise one or more transistors comprising the third flavor so the on chip leakage-current detection device 506 can produce an output signal with a frequency proportional to the leakage of the third flavor at output 506A. These signals may be delivered to a bus where they can be delivered to an output 500A for off-chip processing or delivered to other components (not shown) of the system-on-a-chip 500 for on-chip processing.

The frequency from the output signals may be summed, either on-chip or off depending on the embodiment to produce a frequency value proportional to the total leakage of the system-on-a chip. The frequency value may then be processed depending on the mode of operation, either on chip or off, to derive the total leakage of the system-on-a-chip.

For different modes of operation of a system on a chip, a different number of the flavors of the transistors may be in an OFF state and leaking. The frequency of the respective output signals of the on chip leakage-current detection device for the first flavor 502, the on chip leakage-current detection device for the second flavor 504, and the on chip leakage-current detection device for the third flavor 506 may be summed in proportion to the number of transistors that are OFF in that mode of operation to determine leakage for that mode of operation. For example, in a first mode, the first flavor of transistors may comprise ⅓ of the transistors that are OFF, ⅓ of the second flavor of transistors may comprise ⅙ of the transistors that are off, and the third flavor of transistor may comprise ⅙ of the transistors that are OFF.

For summation, the frequency of the output signal of the on chip leakage-current detection device for the first flavor 502 may be weighted to reflect the ⅓ proportion of transistors of the first flavor that are OFF in the mode of operation, the frequency of the signal for the second on chip leakage current detection device 504 may be weighted to reflect the ⅙ proportion and so on.

Different modes of operation may also have different levels of biasing. The power supply 230 for the on chip leakage-current detection device for the first flavor 502, the on chip leakage-current detection device for the second flavor 504, and the on chip leakage-current detection device for the first flavor 506 may be adjusted accordingly.

Figure 6:
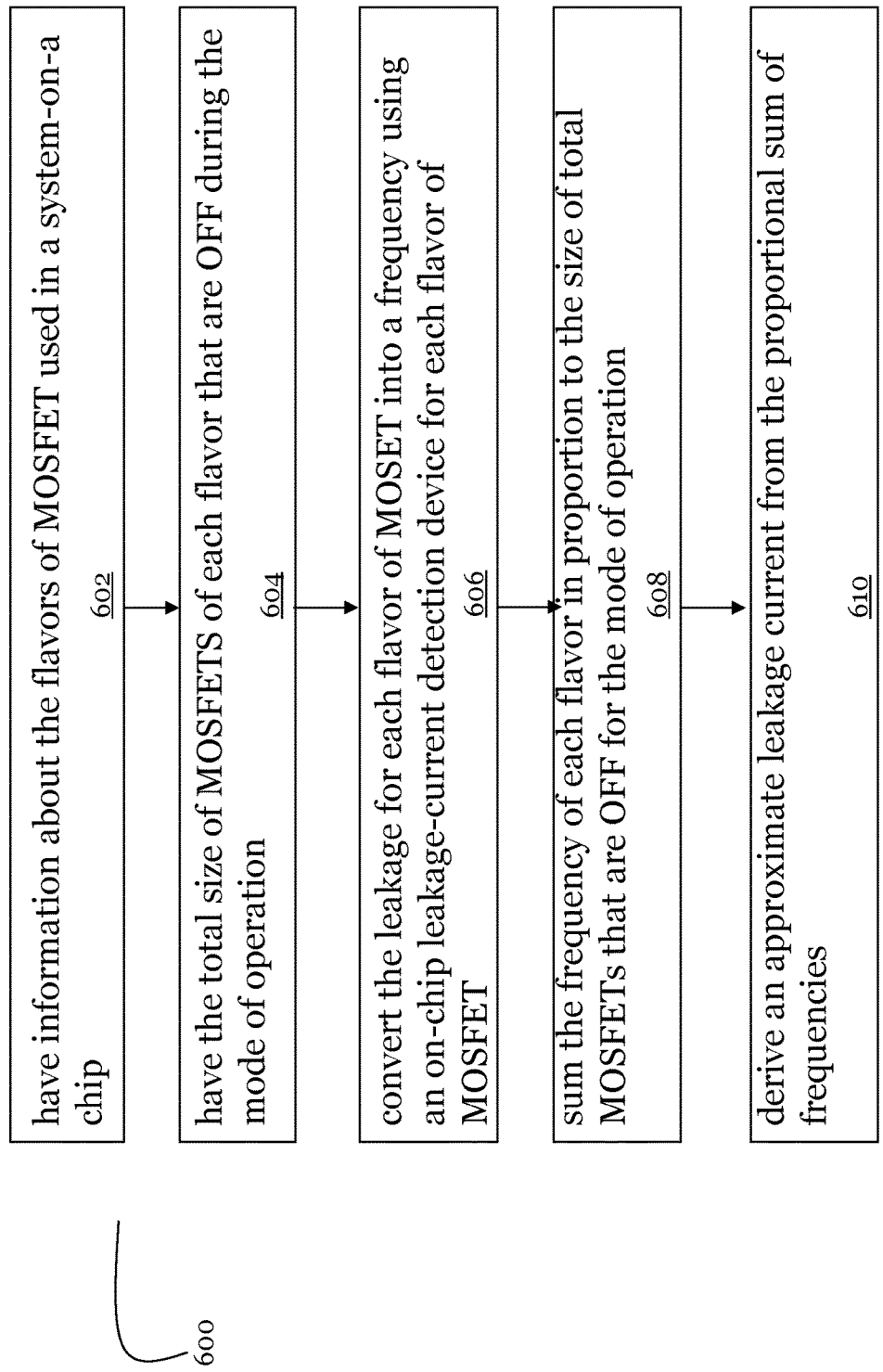
FIG. 6. depicts a method for testing leakage on a system on a chip for a mode of operation.

FIG. 6. depicts a method 600 for testing leakage on a system on a chip for a mode of operation.

At a step 602 the method may comprise having information about the flavors of MOSFET used in a system-on-a chip. In various embodiments, this information may be located in a NET list for the system on a chip. At step 604 the method may comprise having the total size of MOSFETS of each flavor that are OFF during the mode of operation. This information may also be located in a NET list. At a step 606, the method may comprise, converting the leakage for each flavor of MOSFET into a frequency using an on-chip leakage-current detection device for each flavor. At a step 608, the method comprises summing the frequency of each flavor in proportion to the size of total MOSFETs that are OFF for the mode of operation. And, at a step 610 the method may derive an approximate leakage current from the proportional sum of frequencies In various embodiments it may be preferable to have an on-chip leakage-current detection device 200 for various modes of operations.

Figure 7:
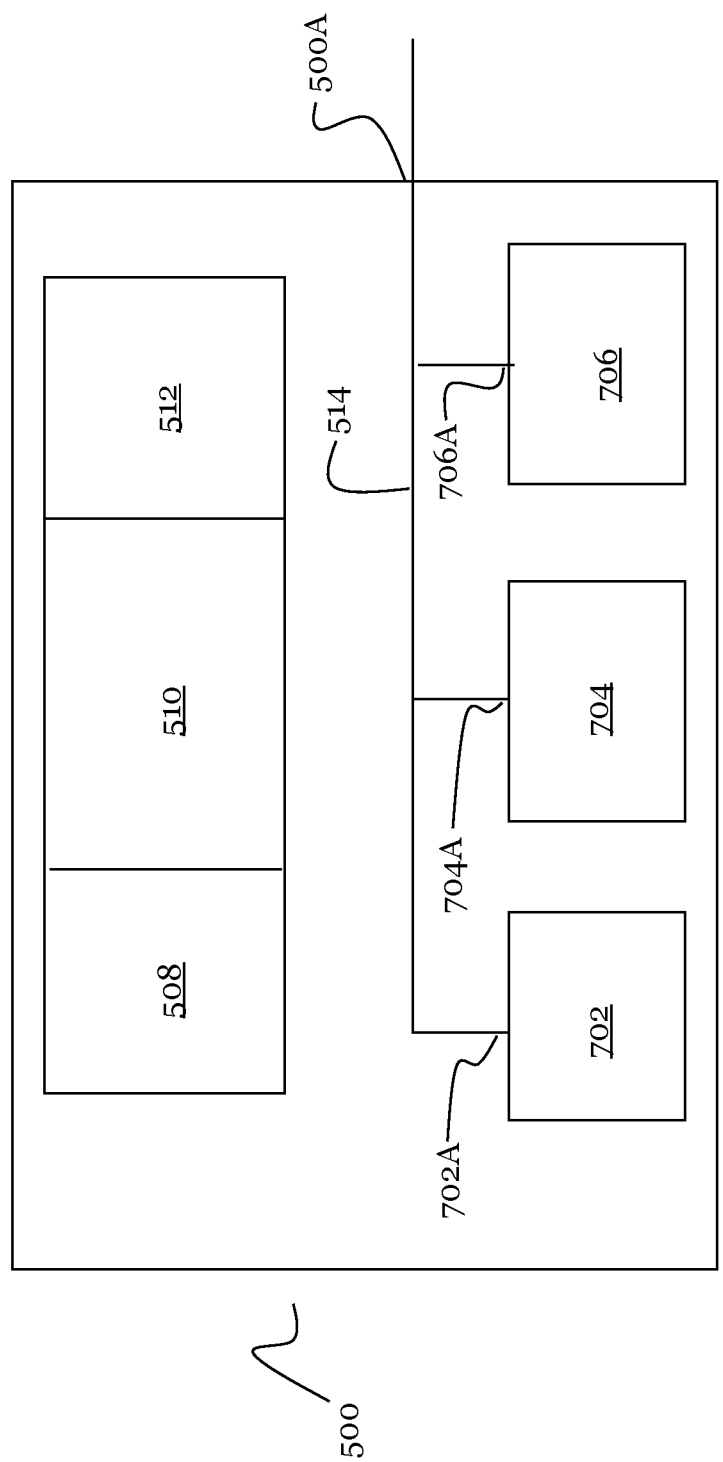
FIG. 7 depicts a system for detecting leakage current on a system-on-a-chip with on-chip leakage-current detection devices for modes of operation of embodiments of the present disclosure.

FIG. 7 depicts a system for detecting leakage current on a system-on-a-chip 500 with on-chip leakage-current detection devices for modes of operation.

The system-on-a-chip 500 may comprise an on-chip leakage-current detection device for a first mode of operation 702, an on-chip leakage-current detection device for a second mode of operation 704, and an on-chip leakage-current detection device for a third mode of operation 706. The system-on-a-chip 500 may also comprise additional on-chip leakage-current detection devices for additional modes. Each of these on-chip leakage-current detection device may comprise any embodiment the on-chip leakage-current detection device 200 and biasing circuit 400 as described in this disclosure.

The target device 210 of the on chip leakage-current detection device for a first mode of operation 702 may comprise more than one flavor of transistor coupled in parallel and sized proportionally to the number of transistors of the same flavor that are OFF for the first mode of operation. For example, target device 210 of the on chip leakage-current detection device for a first mode of operation 702 may comprise a MOSFET of a first flavor and a MOSFET of a second flavor. The MOSFET of the first flavor may be sized proportionally to the total number of MOSFETS of the first flavor that are OFF in the first mode of operation, and the MOSFET of the second flavor may be sized proportionally to the total number of MOSFETS of the second flavor that are OFF in the first mode of operation. As a result, the frequency of a signal produced by the on chip leakage-current detection device may be proportional to the leakage of the system during that mode of operation and it may not be required to sum the frequency to derive the leakage current of the system-on-a-chip 500.

The target device 210 of the on chip leakage-current detection device for a second mode of operation 704 may similarly comprise more than one flavor of transistors coupled in parallel and sized proportionally to the number of transistors of the same flavor that are OFF for the second mode of operation. And, the target device 210 of the on chip leakage-current detection device for a third mode of operation 706 may comprise more than one flavor of transistors coupled in parallel and sized proportionally to the number of transistors of the same flavor that are OFF for the third mode of operation.

Figure 8:
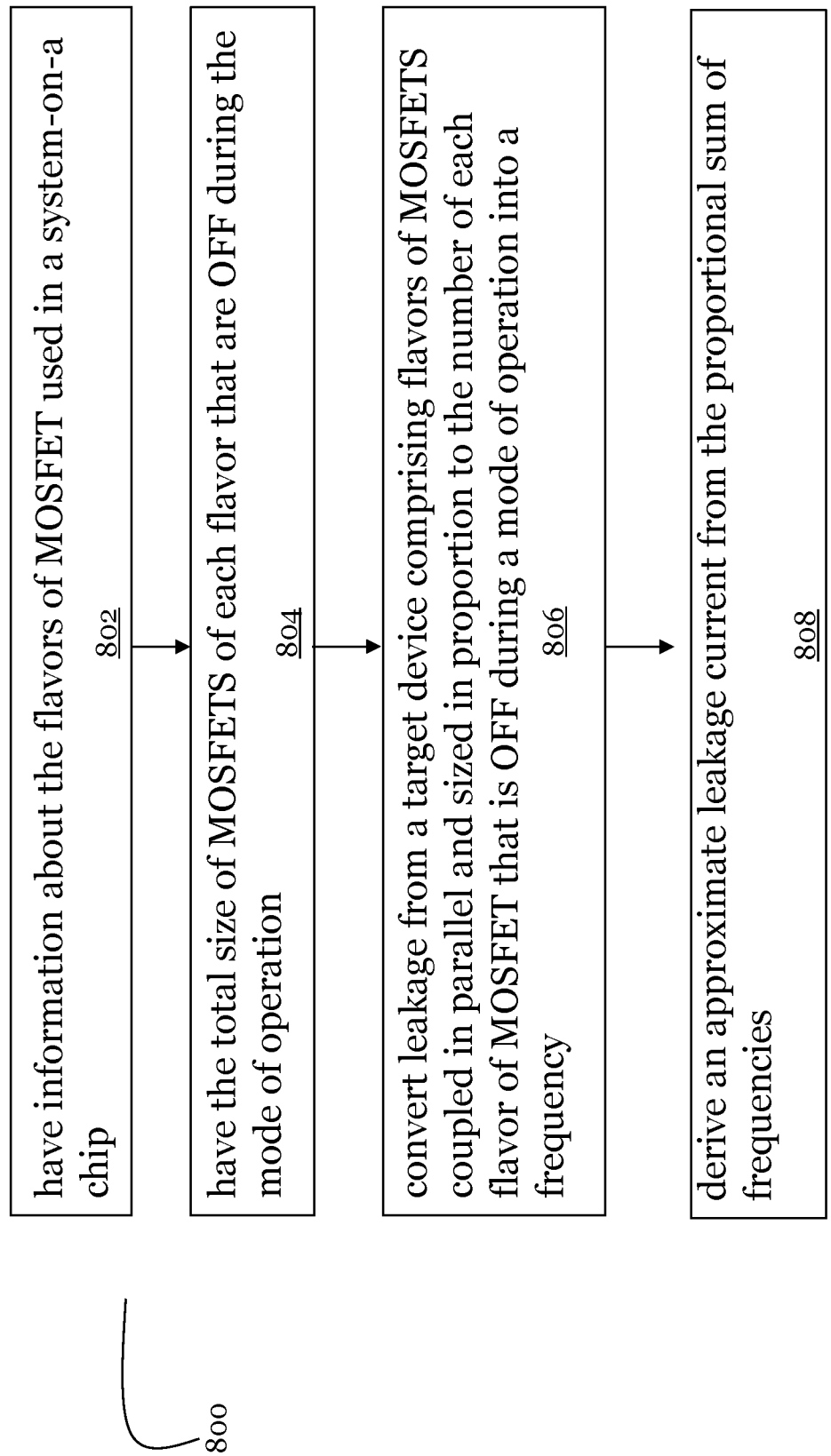
FIG. 8. depicts a method for testing leakage on a system on a chip for a mode of operation.

FIG. 8. depicts a method 800 for testing leakage on a system on a chip for a mode of operation.

Figure 9:
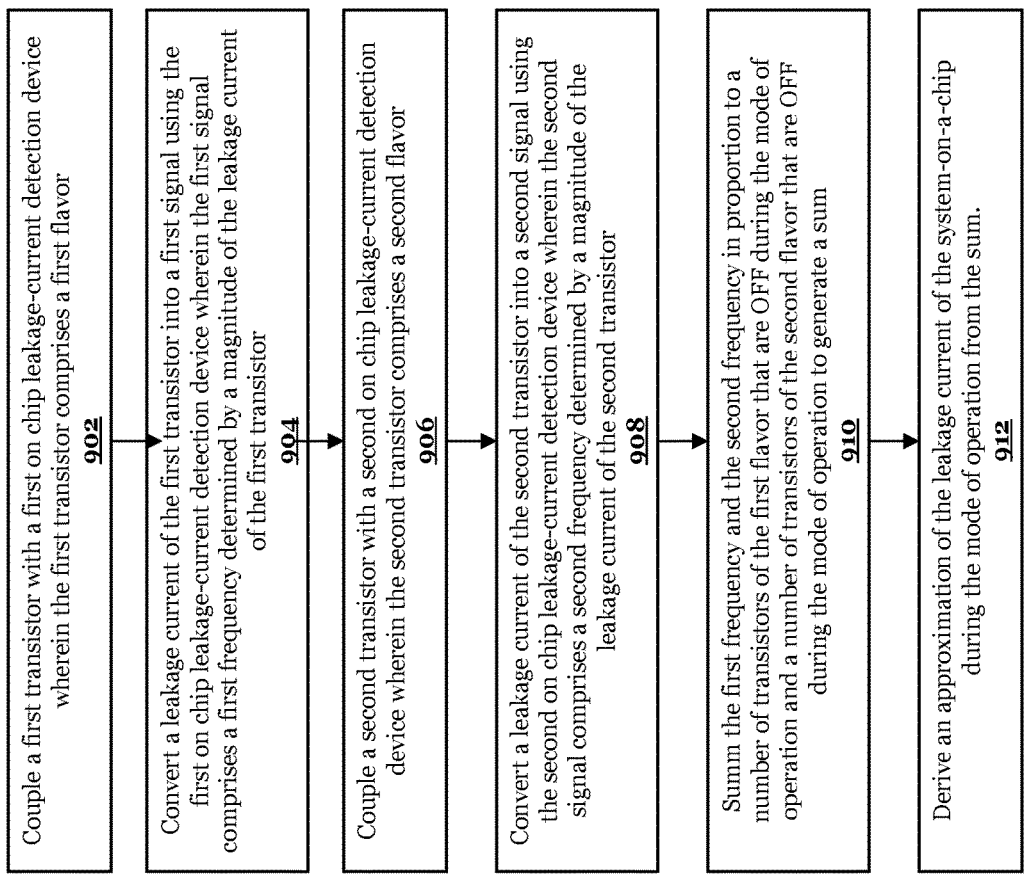
FIG. 9 depicts a method to approximate a leakage current of a system-on-a-chip during a mode of operation.

At a step 802, the method 800 may comprise having information about the flavors of MOSFET used in a system-on-a chip. At a step 804, the method 800 may comprise having the total size of MOSFETS of each flavor that are OFF during the mode of operation. At a step 806, the method may comprise converting leakage from a target device comprising flavors of MOSFETS coupled in parallel and sized in proportion to the number of each flavor of MOSFET that is OFF during a mode of operation into a frequency. At a step 808, the method may comprise deriving an approximate leakage current from the proportional sum of frequencies FIG. 9 depicts a method 900 to approximate a leakage current of a system-on-a-chip during a mode of operation.

The method 900 may comprise at a step 902 coupling a first transistor with a first on chip leakage-current detection device wherein the first transistor comprises a first flavor; at a step 904 converting a leakage current of the first transistor into a first signal using the first on chip leakage-current detection device wherein the first signal comprises a first frequency determined by a magnitude of the leakage current of the first transistor; at a step 906 coupling a second transistor with a second on chip leakage-current detection device wherein the second transistor comprises a second flavor; at a step 908 converting a leakage current of the second transistor into a second signal using the second on chip leakage-current detection device wherein the second signal comprises a second frequency determined by a magnitude of the leakage current of the second transistor; at a step 910 summing the first frequency and the second frequency in proportion to a number of transistors of the first flavor that are OFF during the mode of operation and a number of transistors of the second flavor that are OFF during the mode of operation to generate a sum; and a step 912 deriving an approximation of the leakage current of the system-on-a-chip during the mode of operation from the sum.

The method 900 may further comprise coupling a third transistor with a third on chip leakage-current detection device wherein the third transistor comprises a third flavor; converting a leakage current of the third transistor into a third signal using the third on chip leakage-current detection device wherein the third signal comprises a third frequency determined by a magnitude of the leakage current of the third transistor; and adding the third frequency to the sum in proportion to a number of transistors of the third flavor that are OFF during the mode of operation.

In various embodiments of the method 900 the first on chip leakage-current detection device comprises: a first inverter configured to produce a first high output signal when it receives a low input signal at an input and configured to produce a first low output signal when it receives a high input signal at the input and wherein a magnitude of the first high output signal of the first inverter is determined by the leakage current of the first transistor; a voltage storage device coupled to an output of the first inverter wherein a time to charge the voltage storage device depends on the magnitude of the first high output signal of the first inverter; a second inverter coupled to the voltage storage device and configured to produce a second high output signal when a charge on the voltage storage device is below a switching threshold and to produce a second low output signal when the charge on the voltage storage device is above the switching threshold wherein the switching threshold is determined by a biasing circuit coupled with the second inverter; an odd number of additional inverters coupled in a sequence with a second-inverter output; and wherein a last output of a last inverter in the sequence is coupled with the input of the first inverter and wherein the first signal derived from an output signal produced at the last output of the last inverter in the sequence.

The method 900 may further comprise, wherein the magnitude of the first high output signal of the first inverter increases proportionally to increases in the leakage current of the first transistor.

The method 900 may further comprise, wherein the time to charge the voltage storage device decreases as the magnitude the first high output signal of the first inverter increases.

Figure 10:
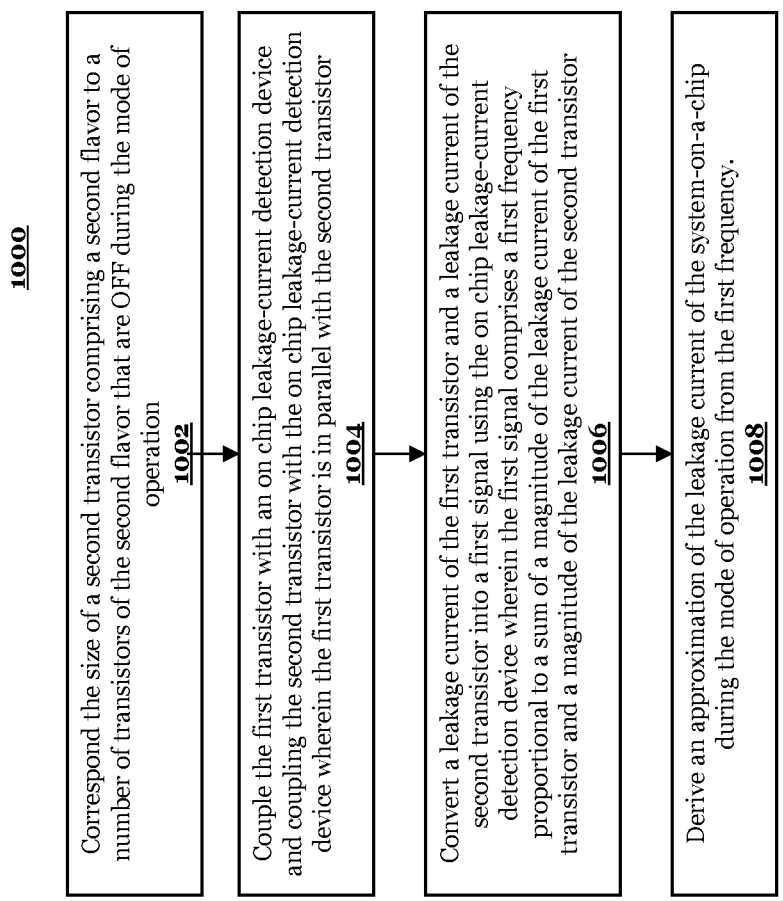
FIG. 10 depicts a method to approximate a leakage current of a system-on-a-chip during a mode of operation.

FIG. 10 depicts a method 1000 to approximate a leakage current of a system-on-a-chip during a mode of operation.

The method 1000 may comprise at a step 1002 corresponding the size of a first transistor comprising a first flavor to a number of transistors of the first flavor that are OFF during the mode of operation; at a step 1004 corresponding the size of a second transistor comprising a second flavor to a number of transistors of the second flavor that are OFF during the mode of operation; at a step 1006 coupling the first transistor with an on chip leakage-current detection device and coupling the second transistor with the on chip leakage-current detection device wherein the first transistor is in parallel with the second transistor; at a step 1008 converting a leakage current of the first transistor and a leakage current of the second transistor into a first signal using the on chip leakage-current detection device wherein the first signal comprises a first frequency proportional to a sum of a magnitude of the leakage current of the first transistor and a magnitude of the leakage current of the second transistor; and at a step 1010 deriving an approximation of the leakage current of the system-on-a-chip during the mode of operation from the first frequency.

In various embodiments the method 1000 may further comprise wherein the on chip leakage-current detection device comprises: a first inverter configured to produce a first high output signal when it receives a low input signal at an input and configured to produce a first low output signal when it receives a high input signal at the input and wherein a magnitude of the first high output signal of the first inverter is determined by the leakage current of the first transistor and the leakage current of the second transistor; a voltage storage device coupled to an output of the first inverter wherein a time to charge the voltage storage device depends on the magnitude of the first high output signal of the first inverter; a second inverter coupled to the voltage storage device and configured to produce a second high output signal when a charge on the voltage storage device is below a switching threshold and to produce a second low output signal when the charge on the voltage storage device is above the switching threshold wherein the switching threshold is determined by a biasing circuit coupled with the second inverter; an odd number of additional inverters coupled in a sequence with a second-inverter output; and wherein a last output of a last inverter in the sequence is coupled with the input of the first inverter and wherein the first signal derived from an output signal produced at the last output of the last inverter in the sequence.

In various embodiments, the method 1000 may comprise, wherein the magnitude of the first high output signal of the first inverter increases proportionally to increases in the leakage current of the first transistor and the leakage current of the second transistor.

In various embodiments, the method 1000 may comprise, wherein the time to charge the voltage storage device decreases as the magnitude the first high output signal of the first inverter increases.

Example 1. An on chip leakage-current detection device including: a first inverter configured to produce a first high output signal when it receives a low input signal at an input and configured to produce a first low output signal when it receives a high input signal at the input, wherein a magnitude of the first high output signal of the first inverter is determined by a leakage current of a target device coupled with the first inverter; a voltage storage device coupled to an output of the first inverter, wherein a time to charge the voltage storage device depends on the magnitude of the first high output signal; a second inverter coupled to the voltage storage device and configured to produce a second high output signal when a charge on the voltage storage device is below a switching threshold and to produce a second low output signal when the charge on the voltage storage device is above the switching threshold, wherein the switching threshold is determined by a biasing circuit coupled with the second inverter; an odd number of additional inverters coupled in a sequence with a output of the second-inverter; and wherein a last output of a last inverter in the sequence is coupled with the input of the first inverter and a frequency of an output signal produced at the last output of the last inverter in the sequence depends on the time to charge the voltage storage device.

Example 2. The on chip leakage-current detection device of example 1, wherein the biasing circuit is configured to maintain the switching threshold at a substantially constant value.

Example 3. The on chip leakage-current detection device of examples 1 or 2, wherein the target device includes a first transistor of a first flavor.

Example 4. The on chip leakage-current detection device of examples 1 to 3, wherein the target device includes a plurality of transistors coupled in parallel with each other.

Example 5. The on chip leakage-current detection device of examples 1 to 4, wherein a first transistor of the plurality of transistors is a first flavor and wherein the first transistor is sized in proportion to a number of OFF transistors in a mode of operation of a chip that are the first flavor.

Example 6. The on chip leakage-current detection device of examples 1 to 5, wherein a second transistor of the plurality of transistors is a second flavor and wherein the second transistor is sized in proportion to a second number of OFF transistors in the mode of operation of the chip that are the second flavor.

Example 7. The on chip leakage-current detection device of examples 1 to 6, wherein the magnitude of the first high output signal increases proportionally to increases in the leakage current of the target device.

Example 8. The on chip leakage-current detection device of examples 1 to 8, wherein the time to charge the voltage storage device decreases as the magnitude the first high output signal increases.

Example 9. An on chip leakage-current detection device including: a first inverter that includes: a PMOS transistor, wherein a source of the PMOS transistor is configured to be coupled to a power supply; an NMOS transistor, wherein a source of the NMOS transistor is coupled to a ground; an output node disposed between a drain of the PMOS transistor and a drain of the NMOS transistor; and wherein an input of the first inverter is coupled to a control gate of the PMOS transistor and a control gate of the NMOS transistor.

The on chip leakage-current detection device further includes a target device coupled in series between the drain of the PMOS transistor and the drain of the NMOS transistor, the first inverter being configured so a leakage current flows through the target device to the output node when the target device is in an OFF state; a storage capacitor coupled at a first plate to the output node of the first inverter and coupled at a second plate to the ground; a second inverter configured to produce a high output signal when a charge on the storage capacitor is below a switching threshold and to produce a low output signal when the charge on the storage capacitor is above the switching threshold, wherein the switching threshold is determined by a biasing circuit coupled with the second inverter that includes: a biasing PMOS transistor, wherein a source of the biasing PMOS transistor is configured to be coupled to the power supply; an inverting PMOS transistor, wherein a source of the inverting PMOS transistor is coupled to a drain of the biasing PMOS transistor; an inverting NMOS transistor, wherein a drain of the inverting NMOS transistor is coupled to a drain of the inverting PMOS transistor; a biasing NMOS transistor, wherein a drain of the biasing NMOS transistor is coupled to a source of the inverting NMOS transistor and a source of the biasing NMOS transistor is coupled with the ground; and wherein the first plate of the storage capacitor is coupled to a control gate of the inverting NMOS transistor and a control gate of the inverting PMOS transistor and an output of the biasing circuit is coupled to the control gate of the biasing PMOS transistor and coupled to the control gate of the biasing NMOS transistor.

The on chip leakage-current detection device further includes an odd number of additional inverters coupled in a sequence with an output of the second-inverter wherein a last output of a last inverter in the sequence is coupled with the input of the first inverter and a frequency of an output signal produced at the last output of the last inverter in the sequence depends on a time to charge the storage capacitor.

Example 10. The on chip leakage-current detection device of examples 9, wherein the time to charge the storage capacitor depends on a magnitude of the leakage current.

Example 11. The on chip leakage-current detection device of examples 9 or 10, wherein the biasing circuit includes: a first biasing-circuit PMOS transistor wherein a source of the first biasing-circuit PMOS transistor is configured to be coupled to the power supply; a second biasing-circuit PMOS transistor wherein a source of the second biasing-circuit PMOS transistor is coupled to a drain of the first biasing-circuit PMOS transistor; a first biasing-circuit NMOS transistor wherein a drain of the first biasing-circuit NMOS transistor is coupled to a drain of the second biasing-circuit PMOS transistor; a second biasing-circuit NMOS transistor wherein a drain of the second biasing-circuit NMOS transistor is coupled to a source of the first biasing-circuit NMOS transistor and a source of the second biasing-circuit NMOS transistor is coupled with the ground; a negative feedback node disposed between the drain of the second biasing-circuit PMOS transistor and the drain of the first biasing-circuit NMOS transistor, the negative feedback node being coupled to a control gate of the first biasing-circuit PMOS transistor and a control gate of the second biasing-circuit NMOS transistor; a voltage divider including a voltage divider output between a first end of the voltage divider that is configured to be coupled to the power supply and a second end of the voltage divider that is configured to be coupled to the ground; wherein a control gate of the second biasing-circuit PMOS transistor and a control gate of the first biasing-circuit NMOS transistor is coupled to the voltage divider output; and wherein the voltage divider is configured to provide a voltage at the voltage divider output that is equal to a voltage level of the switching threshold.

Example 12. The on chip leakage-current detection device of examples 9 to 11, wherein the negative feedback node of the biasing circuit is coupled to a control gate of the biasing PMOS transistor of the second inverter and coupled to a control gate of the biasing NMOS transistor of the second inverter.

Example 13. The on chip leakage-current detection device of examples 9 to 12, wherein the target device includes a target PMOS transistor wherein a control gate of the target PMOS transistor is configured to be coupled to the power supply; a source of the target PMOS transistor is coupled to the drain of the PMOS transistor of the first inverter; a drain of the target PMOS transistor is coupled to the drain of the NMOS transistor of the first inverter; and wherein the output node of the first inverter is disposed between the drain of the target PMOS transistor and the drain of the NMOS transistor of the first inverter.

Example 14. The on chip leakage-current detection device of examples 9 to 13, further including a latch where the latch includes: a first PMOS transistor including: a source configured to be coupled to the power supply; a control gate coupled to the second-inverter output; and a drain. The latch further including a second PMOS transistor including: a source coupled to the drain of the first PMOS transistor; a control gate coupled to the input of the first inverter; and a drain coupled to the output node of the first inverter.

Example 15. The on chip leakage-current detection device of examples 9 to 14, wherein the target device includes a target NMOS transistor wherein a control gate of the target NMOS transistor is coupled to the ground; a source of the target NMOS transistor is coupled to the drain of the NMOS transistor of the first inverter; a drain of the target NMOS transistor is coupled to the drain of the PMOS transistor of the first inverter; and wherein the output node of the first inverter is disposed between the drain of the target NMOS transistor and the drain of the PMOS transistor of the first inverter.

Example 16. The on chip leakage-current detection device of examples 9 to 15, further including a latch including: a first NMOS transistor including a source be coupled to the ground, a control gate coupled to the second-inverter output; and a drain; and a second NMOS transistor including: a source coupled to the drain of the first NMOS transistor; a control gate coupled to the input of the first inverter; and a drain coupled to the output node of the first inverter.

Example 17. A method to approximate a leakage current of a system-on-a-chip during a mode of operation, the method including: coupling a first transistor with a first on chip leakage-current detection device, wherein the first transistor is a first flavor; converting a leakage current of the first transistor into a first signal using the first on chip leakage-current detection device, wherein the first signal has a first frequency determined by a magnitude of the leakage current of the first transistor; coupling a second transistor with a second on chip leakage-current detection device, wherein the second transistor is a second flavor; converting a leakage current of the second transistor into a second signal using the second on chip leakage-current detection device, wherein the second signal has a second frequency determined by a magnitude of the leakage current of the second transistor; summing the first frequency and the second frequency in proportion to a number of transistors that are the first flavor that are OFF during the mode of operation and a number of transistors that are the second flavor that are OFF during the mode of operation to generate a sum; and deriving an approximation of the leakage current of the system-on-a-chip during the mode of operation from the sum.

Example 18. The method to approximate the leakage current of the system-on-a-chip during the mode of operation of example 17, further including: coupling a third transistor with a third on chip leakage-current detection device wherein the third transistor is a third flavor; converting a leakage current of the third transistor into a third signal using the third on chip leakage-current detection device wherein the third signal has a third frequency determined by a magnitude of the leakage current of the third transistor; and adding the third frequency to the sum in proportion to a number of transistors that are the third flavor that are OFF during the mode of operation.

Example 19. The method to approximate the leakage current of the system-on-a-chip during the mode of operation of examples 17-18, wherein the first on chip leakage-current detection device includes: a first inverter configured to produce a first high output signal when it receives a low input signal at an input and configured to produce a first low output signal when it receives a high input signal at the input and wherein a magnitude of the first high output signal of the first inverter is determined by the leakage current of the first transistor; a voltage storage device coupled to an output of the first inverter wherein a time to charge the voltage storage device depends on the magnitude of the first high output signal of the first inverter; a second inverter coupled to the voltage storage device and configured to produce a second high output signal when a charge on the voltage storage device is below a switching threshold and to produce a second low output signal when the charge on the voltage storage device is above the switching threshold wherein the switching threshold is determined by a biasing circuit coupled with the second inverter; an odd number of additional inverters coupled in a sequence with a second-inverter output; and wherein a last output of a last inverter in the sequence is coupled with the input of the first inverter and wherein the first signal derived from an output signal produced at the last output of the last inverter in the sequence.

Example 20. The method to approximate the leakage current of the system-on-a-chip during the mode of operation of examples 17 to 19, wherein the magnitude of the first high output signal of the first inverter increases proportionally to increases in the leakage current of the first transistor.

Example 21. The method to approximate the leakage current of the system-on-a-chip during the mode of operation of examples 17 to 20, wherein the time to charge the voltage storage device decreases as the magnitude the first high output signal of the first inverter increases.

Example 22. A method to approximate a leakage current of a system-on-a-chip during a mode of operation including: corresponding the size of a first transistor that is a first flavor to a number of transistors that are the first flavor that are OFF during the mode of operation; corresponding the size of a second transistor that is a second flavor to a number of transistors that are the second flavor that are OFF during the mode of operation; coupling the first transistor with an on chip leakage-current detection device and coupling the second transistor with the on chip leakage-current detection device wherein the first transistor is in parallel with the second transistor; converting a leakage current of the first transistor and a leakage current of the second transistor into a first signal using the on chip leakage-current detection device wherein the first signal has a first frequency proportional to a sum of a magnitude of the leakage current of the first transistor and a magnitude of the leakage current of the second transistor; and deriving an approximation of the leakage current of the system-on-a-chip during the mode of operation from the first frequency.

Example 23. The method to approximate the leakage current of the system-on-a-chip during the mode of operation of example 22, wherein the on chip leakage-current detection device includes: a first inverter configured to produce a first high output signal when it receives a low input signal at an input and configured to produce a first low output signal when it receives a high input signal at the input and wherein a magnitude of the first high output signal of the first inverter is determined by the leakage current of the first transistor and the leakage current of the second transistor; a voltage storage device coupled to an output of the first inverter wherein a time to charge the voltage storage device depends on the magnitude of the first high output signal of the first inverter; a second inverter coupled to the voltage storage device and configured to produce a second high output signal when a charge on the voltage storage device is below a switching threshold and to produce a second low output signal when the charge on the voltage storage device is above the switching threshold wherein the switching threshold is determined by a biasing circuit coupled with the second inverter; an odd number of additional inverters coupled in a sequence with a second-inverter output; and wherein a last output of a last inverter in the sequence is coupled with the input of the first inverter and wherein the first signal derived from an output signal produced at the last output of the last inverter in the sequence.

Example 24. The method to approximate the leakage current of the system-on-a-chip during the mode of operation of claims 22-23, wherein the magnitude of the first high output signal of the first inverter increases proportionally to increases in the leakage current of the first transistor and the leakage current of the second transistor.

Example 25. The method to approximate the leakage current of the system-on-a-chip during the mode of operation of examples 22-24, wherein the time to charge the voltage storage device decreases as the magnitude the first high output signal of the first inverter increases.

References to illustrative embodiments in this description are not intended to be construed in a limiting sense. Various modifications and combinations of the illustrative embodiments, as well as other embodiments will be apparent to persons skilled in the art upon reference to the description. It is therefore intended that the appended claims encompass any such modifications or embodiments.

What is claimed is:

1. An on chip leakage-current detection device comprising:
a first inverter configured to produce a first high output signal when it receives a low input signal at an input and configured to produce a first low output signal when it receives a high input signal at the input, wherein a magnitude of the first high output signal of the first inverter is determined by a leakage current of a target device coupled with the first inverter;

a voltage storage device coupled to an output of the first inverter, wherein a time to charge the voltage storage device depends on the magnitude of the first high output signal;

a second inverter coupled to the voltage storage device and configured to produce a second high output signal when a charge on the voltage storage device is below a switching threshold and to produce a second low output signal when the charge on the voltage storage device is above the switching threshold, wherein the switching threshold is determined by a biasing circuit coupled with the second inverter;

an odd number of additional inverters coupled in a sequence with a output of the second-inverter; and wherein a last output of a last inverter in the sequence is coupled with the input of the first inverter and a frequency of an output signal produced at the last output of the last inverter in the sequence depends on the time to charge the voltage storage device.

2. The on chip leakage-current detection device of claim 1, wherein the biasing circuit is configured to maintain the switching threshold at a substantially constant value.

3. The on chip leakage-current detection device of claim 1, wherein the target device comprises a first transistor of a first flavor.

4. The on chip leakage-current detection device of claim 1, wherein the target device comprises a plurality of transistors coupled in parallel with each other.

5. The on chip leakage-current detection device of claim 4, wherein a first transistor of the plurality of transistors comprises a first flavor and wherein the first transistor is sized in proportion to a number of OFF transistors in a mode of operation of a chip that comprise the first flavor.

6. The on chip leakage-current detection device of claim 5, wherein a second transistor of the plurality of transistors comprises a second flavor and wherein the second transistor is sized in proportion to a second number of OFF transistors in the mode of operation of the chip that comprise the second flavor.

7. The on chip leakage-current detection device of claim 1, wherein the magnitude of the first high output signal increases proportionally to increases in the leakage current of the target device.

8. The on chip leakage-current detection device of claim 7, wherein the time to charge the voltage storage device decreases as the magnitude the first high output signal increases.

9. An on chip leakage-current detection device comprising:
a first inverter comprising:
a PMOS transistor, wherein a source of the PMOS transistor is configured to be coupled to a power supply;
an NMOS transistor, wherein a source of the NMOS transistor is coupled to a ground;
an output node disposed between a drain of the PMOS transistor and a drain of the NMOS transistor; and
wherein an input of the first inverter is coupled to a control gate of the PMOS transistor and a control gate of the NMOS transistor;
a target device coupled in series between the drain of the PMOS transistor and the drain of the NMOS transistor, the first inverter being configured so a leakage current flows through the target device to the output node when the target device is in an OFF state;

a storage capacitor coupled at a first plate to the output node of the first inverter and coupled at a second plate to the ground;

a second inverter configured to produce a high output signal when a charge on the storage capacitor is below a switching threshold and to produce a low output signal when the charge on the storage capacitor is above the switching threshold, wherein the switching threshold is determined by a biasing circuit coupled with the second inverter comprising:
a biasing PMOS transistor, wherein a source of the biasing PMOS transistor is configured to be coupled to the power supply;
an inverting PMOS transistor, wherein a source of the inverting PMOS transistor is coupled to a drain of the biasing PMOS transistor;
an inverting NMOS transistor, wherein a drain of the inverting NMOS transistor is coupled to a drain of the inverting PMOS transistor;
a biasing NMOS transistor, wherein a drain of the biasing NMOS transistor is coupled to a source of the inverting NMOS transistor and a source of the biasing NMOS transistor is coupled with the ground; and
wherein the first plate of the storage capacitor is coupled to a control gate of the inverting NMOS transistor and a control gate of the inverting PMOS transistor and an output of the biasing circuit is coupled to the control gate of the biasing PMOS transistor and coupled to the control gate of the biasing NMOS transistor;

an odd number of additional inverters coupled in a sequence with an output of the second-inverter; and wherein a last output of a last inverter in the sequence is coupled with the input of the first inverter and a frequency of an output signal produced at the last output of the last inverter in the sequence depends on a time to charge the storage capacitor.

10. The on chip leakage-current detection device of claim 9, wherein the time to charge the storage capacitor depends on a magnitude of the leakage current.

11. The on chip leakage-current detection device of claim 9, wherein the biasing circuit comprises:
a first biasing-circuit PMOS transistor wherein a source of the first biasing-circuit PMOS transistor is configured to be coupled to the power supply;
a second biasing-circuit PMOS transistor wherein a source of the second biasing-circuit PMOS transistor is coupled to a drain of the first biasing-circuit PMOS transistor;
a first biasing-circuit NMOS transistor wherein a drain of the first biasing-circuit NMOS transistor is coupled to a drain of the second biasing-circuit PMOS transistor;
a second biasing-circuit NMOS transistor wherein a drain of the second biasing-circuit NMOS transistor is coupled to a source of the first biasing-circuit NMOS transistor and a source of the second biasing-circuit NMOS transistor is coupled with the ground;
a negative feedback node disposed between the drain of the second biasing-circuit PMOS transistor and the drain of the first biasing-circuit NMOS transistor, the negative feedback node being coupled to a control gate of the first biasing-circuit PMOS transistor and a control gate of the second biasing-circuit NMOS transistor;
a voltage divider comprising a voltage divider output between a first end of the voltage divider that is configured to be coupled to the power supply and a second end of the voltage divider that is configured to be coupled to the ground;

wherein a control gate of the second biasing-circuit PMOS transistor and a control gate of the first biasing-circuit NMOS transistor is coupled to the voltage divider output; and wherein the voltage divider is configured to provide a voltage at the voltage divider output that is equal to a voltage level of the switching threshold.

12. The on chip leakage-current detection device of claim 11, wherein the negative feedback node of the biasing circuit is coupled to a control gate of the biasing PMOS transistor of the second inverter and coupled to a control gate of the biasing NMOS transistor of the second inverter.

13. The on chip leakage-current detection device of claim 9, wherein the target device comprises a target PMOS transistor; wherein a control gate of the target PMOS transistor is configured to be coupled to the power supply; a source of the target PMOS transistor is coupled to the drain of the PMOS transistor of the first inverter; a drain of the target PMOS transistor is coupled to the drain of the NMOS transistor of the first inverter; and wherein the output node of the first inverter is disposed between the drain of the target PMOS transistor and the drain of the NMOS transistor of the first inverter.

14. The on chip leakage-current detection device of claim 13, further comprising a latch where the latch comprises:
a first PMOS transistor comprising:
a source configured to be coupled to the power supply;
a control gate coupled to the second-inverter output; and
a drain; and
a second PMOS transistor comprising:
a source coupled to the drain of the first PMOS transistor;
a control gate coupled to the input of the first inverter; and
a drain coupled to the output node of the first inverter.

15. The on chip leakage-current detection device of claim 9, wherein the target device comprises a target NMOS transistor wherein a control gate of the target NMOS transistor is coupled to the ground; a source of the target NMOS transistor is coupled to the drain of the NMOS transistor of the first inverter; a drain of the target NMOS transistor is coupled to the drain of the PMOS transistor of the first inverter; and wherein the output node of the first inverter is disposed between the drain of the target NMOS transistor and the drain of the PMOS transistor of the first inverter.

16. The on chip leakage-current detection device of claim 15, further comprising a latch comprising:
a first NMOS transistor comprising:
a source be coupled to the ground;
a control gate coupled to the second-inverter output; and
a drain; and
a second NMOS transistor comprising:
a source coupled to the drain of the first NMOS transistor;
a control gate coupled to the input of the first inverter; and
a drain coupled to the output node of the first inverter.

17. A method to approximate a leakage current of a system-on-a-chip during a mode of operation, the method comprising:

coupling a first transistor with a first on chip leakage-current detection device, wherein the first transistor comprises a first flavor;
converting a leakage current of the first transistor into a first signal using the first on chip leakage-current detection device, wherein the first signal comprises a first frequency determined by a magnitude of the leakage current of the first transistor;
coupling a second transistor with a second on chip leakage-current detection device, wherein the second transistor comprises a second flavor;
converting a leakage current of the second transistor into a second signal using the second on chip leakage-current detection device, wherein the second signal comprises a second frequency determined by a magnitude of the leakage current of the second transistor;
summing the first frequency and the second frequency in proportion to a number of transistors of the first flavor that are OFF during the mode of operation and a number of transistors of the second flavor that are OFF during the mode of operation to generate a sum; and
deriving an approximation of the leakage current of the system-on-a-chip during the mode of operation from the sum.

18. The method to approximate the leakage current of the system-on-a-chip during the mode of operation of claim 17, further comprising:
coupling a third transistor with a third on chip leakage-current detection device wherein the third transistor comprises a third flavor;
converting a leakage current of the third transistor into a third signal using the third on chip leakage-current detection device wherein the third signal comprises a third frequency determined by a magnitude of the leakage current of the third transistor; and
adding the third frequency to the sum in proportion to a number of transistors of the third flavor that are OFF during the mode of operation.

19. The method to approximate the leakage current of the system-on-a-chip during the mode of operation of claim 17, wherein the first on chip leakage-current detection device comprises:
a first inverter configured to produce a first high output signal when it receives a low input signal at an input and configured to produce a first low output signal when it receives a high input signal at the input and wherein a magnitude of the first high output signal of the first inverter is determined by the leakage current of the first transistor;
a voltage storage device coupled to an output of the first inverter wherein a time to charge the voltage storage device depends on the magnitude of the first high output signal of the first inverter;
a second inverter coupled to the voltage storage device and configured to produce a second high output signal when a charge on the voltage storage device is below a switching threshold and to produce a second low output signal when the charge on the voltage storage device is above the switching threshold wherein the switching threshold is determined by a biasing circuit coupled with the second inverter;
an odd number of additional inverters coupled in a sequence with a second-inverter output; and
wherein a last output of a last inverter in the sequence is coupled with the input of the first inverter and wherein the first signal derived from an output signal produced at the last output of the last inverter in the sequence.

20. The method to approximate the leakage current of the system-on-a-chip during the mode of operation of claim 19, wherein the magnitude of the first high output signal of the first inverter increases proportionally to increases in the leakage current of the first transistor.

21. The method to approximate the leakage current of the system-on-a-chip during the mode of operation of claim 20, wherein the time to charge the voltage storage device decreases as the magnitude the first high output signal of the first inverter increases.

22. A method to approximate a leakage current of a system-on-a-chip during a mode of operation comprising:
    corresponding the size of a first transistor comprising a first flavor to a number of transistors of the first flavor that are OFF during the mode of operation;
    corresponding the size of a second transistor comprising a second flavor to a number of transistors of the second flavor that are OFF during the mode of operation;
    coupling the first transistor with an on chip leakage-current detection device and coupling the second transistor with the on chip leakage-current detection device wherein the first transistor is in parallel with the second transistor;
    converting a leakage current of the first transistor and a leakage current of the second transistor into a first signal using the on chip leakage-current detection device wherein the first signal comprises a first frequency proportional to a sum of a magnitude of the leakage current of the first transistor and a magnitude of the leakage current of the second transistor; and
    deriving an approximation of the leakage current of the system-on-a-chip during the mode of operation from the first frequency.

23. The method to approximate the leakage current of the system-on-a-chip during the mode of operation of claim 22, wherein the on chip leakage-current detection device comprises:
    a first inverter configured to produce a first high output signal when it receives a low input signal at an input and configured to produce a first low output signal when it receives a high input signal at the input and wherein a magnitude of the first high output signal of the first inverter is determined by the leakage current of the first transistor and the leakage current of the second transistor;
    a voltage storage device coupled to an output of the first inverter wherein a time to charge the voltage storage device depends on the magnitude of the first high output signal of the first inverter;
    a second inverter coupled to the voltage storage device and configured to produce a second high output signal when a charge on the voltage storage device is below a switching threshold and to produce a second low output signal when the charge on the voltage storage device is above the switching threshold wherein the switching threshold is determined by a biasing circuit coupled with the second inverter;
    an odd number of additional inverters coupled in a sequence with a second-inverter output; and
    wherein a last output of a last inverter in the sequence is coupled with the input of the first inverter and wherein the first signal derived from an output signal produced at the last output of the last inverter in the sequence.

24. The method to approximate the leakage current of the system-on-a-chip during the mode of operation of claim 23, wherein the magnitude of the first high output signal of the first inverter increases proportionally to increases in the leakage current of the first transistor and the leakage current of the second transistor.

25. The method to approximate the leakage current of the system-on-a-chip during the mode of operation of claim 24, wherein the time to charge the voltage storage device decreases as the magnitude the first high output signal of the first inverter increases.

\* \* \* \* \*